United States Patent
Li et al.

(10) Patent No.: US 9,991,005 B2
(45) Date of Patent: Jun. 5, 2018

(54) SHIFT REGISTER AND DRIVING METHOD THEREOF

(71) Applicants: Shanghai Tianma AM-OLED Co., Ltd., Shanghai (CN); Tianma Micro-Electronics Co., Ltd., Shenzhen (CN)

(72) Inventors: Yuan Li, Xiamen (CN); Dong Qian, Shanghai (CN)

(73) Assignees: Shanghai Tianma AM-OLED Co., Ltd., Shanghai (CN); Tianma Micro-Electronics Co., Ltd., Shenzhen (CN)

(*) Notice: Subject to any disclaimer, the term of this patent is extended or adjusted under 35 U.S.C. 154(b) by 224 days.

(21) Appl. No.: 15/159,824

(22) Filed: May 20, 2016

(65) Prior Publication Data
US 2017/0004889 A1 Jan. 5, 2017

(30) Foreign Application Priority Data
Jun. 30, 2015 (CN) .......................... 2015 1 0386680

(51) Int. Cl.
| G11C 19/00 | (2006.01) |
| G11C 19/28 | (2006.01) |
| G09G 3/3266 | (2016.01) |
| G11C 19/18 | (2006.01) |
| G09G 3/36 | (2006.01) |

(52) U.S. Cl.
CPC ........... *G11C 19/28* (2013.01); *G09G 3/3266* (2013.01); *G11C 19/184* (2013.01); *G09G 3/3677* (2013.01); *G09G 2310/0286* (2013.01)

(58) Field of Classification Search
None
See application file for complete search history.

(56) References Cited

U.S. PATENT DOCUMENTS

| 2014/0002423 A1* | 1/2014 | Choi .................... G09G 3/3688 345/204 |
| 2014/0055444 A1 | 2/2014 | Jang |
| 2014/0079176 A1* | 3/2014 | Qian ...................... G11C 19/28 377/77 |

(Continued)

FOREIGN PATENT DOCUMENTS

KR 101022092 B1 3/2011

*Primary Examiner* — Tuan T Lam
(74) *Attorney, Agent, or Firm* — Kilpatrick Townsend & Stockton LLP

(57) ABSTRACT

The present disclosure provides a shift register and a method for driving the shift register. The shift register includes a first input module, a second input module and an output module. The first input module includes a first transistor and a second transistor, both being connected with a first input terminal, a fourth input terminal and a fifth input terminal. The second input module is connected with a second input terminal, a third input terminal and a fourth input terminal. The second input terminal is electrically connected with the first input module at a first node. The output module being connected with a fifth input terminal, a sixth input terminal and a first output terminal, the output module being electrically connected with the first input module at the first node and the second node, and the output module being electrically connected with the second input module at the first node.

17 Claims, 10 Drawing Sheets

(56) References Cited

U.S. PATENT DOCUMENTS

| | | | |
|---|---|---|---|
| 2016/0189796 A1* | 6/2016 | Wu | G11C 19/28 |
| | | | 345/211 |
| 2016/0217870 A1* | 7/2016 | Tseng | G11C 19/28 |
| 2016/0372041 A1* | 12/2016 | Sun | G09G 3/20 |
| 2017/0004801 A1* | 1/2017 | Li | G11C 19/28 |
| 2017/0084222 A1* | 3/2017 | Sun | G09G 3/32 |
| 2017/0124936 A1* | 5/2017 | Tseng | G09G 3/2092 |
| 2017/0200418 A1* | 7/2017 | Zhang | G09G 3/3266 |
| 2017/0206824 A1* | 7/2017 | Sun | G09G 3/2092 |
| 2017/0256204 A1* | 9/2017 | Xiang | G09G 3/3258 |
| 2017/0287388 A1* | 10/2017 | Ma | G09G 3/2092 |
| 2017/0287413 A1* | 10/2017 | Li | G09G 3/3426 |

* cited by examiner

SHIFT REGISTER AND DRIVING METHOD THEREOF

CROSS-REFERENCE TO RELATED APPLICATIONS

This application is based upon and claims priority to Chinese Patent Application 201510386680.X, filed on Jun. 30, 2015, the entire contents of which are incorporated herein by reference.

Technical Field

The present disclosure relates to display technology, and more particularly, to a shift register and a driving method thereof.

Background

A shift register stores data, and further allows the data stored therein to shift leftwards or rightwards under a clock signal.

In a technical solution provided in US patent application US20140055444A1, a shift register is illustrated in FIG. 1a, and the driving timing diagram is illustrated in FIG. 1b. With reference to FIGS. 1a and 1b, at the time point t5, either of the following cases will occur in the shift register: a) as CLK2 turns low, CLK2 will pull down the node N1 by the coupling of C1, and then M2 will turn on to pull up the node N2, thereby the shift register cannot operate normally; b) as CLK2 turns low, CLK2 will pull down the node N1 by the coupling of C1, while meantime the node N2 is at a low level and thus both M5 and M4 are turned on, and the node N1 will be pulled up to a high level before M2 turns on, thereby ensuring normal operation of the circuit.

Accordingly, in the prior art shift resistor there exist a risk of competition, which deteriorates the stability of the circuit.

SUMMARY

Accordingly, the present disclosure provides a shift register and a driving method thereof.

The present disclosure provides a shift register, including:
a first input module, a second input module and an output module; and
a first input terminal, a second input terminal, a third input terminal, a fourth input terminal, a fifth input terminal, a sixth input terminal and a first output terminal, wherein a first pulse signal is inputted to the first input terminal, a second pulse signal is inputted to the second input terminal, a first clock signal is inputted to the third input terminal, a second clock signal is inputted to the fourth input terminal, a first level signal is inputted to the fifth input terminal, and a second level signal is inputted to the sixth input terminal being; and, wherein
the first input module comprises a first transistor and a second transistor, a gate electrode of the first transistor being connected with the first input terminal, a source electrode of the first transistor being connected with the fifth input terminal, a drain electrode of the first transistor being connected with a first node, a gate electrode of the second transistor being connected with the first input terminal, a source electrode of the second transistor being connected with the fourth input terminal, and a drain electrode of the second transistor being connected with a second node,
the second input module being connected with the second input terminal, the third input terminal and the fourth input terminal, and the second input terminal being electrically connected with the first input module at the first node, and the output module being connected with the fifth input terminal, the sixth input terminal and the first output terminal, the output module being electrically connected with the first input module at the first node and the second node, and the output module being electrically connected with the second input module at the first node.

The present disclosure further provides a method for driving the above shift register, including:
a first input module, a second input module and an output module, the first input module, the second input module and the output module being electrically connected at a first node, the output module being electrically connected with the first input module at a second node, the first input module comprising a first transistor having a gate electrode thereof connected with a first input terminal, a source electrode thereof connected with a fifth input terminal and a drain electrode thereof connected with the first node, and a second transistor having a gate electrode thereof connected with the first input terminal, a source electrode thereof connected with a fourth input terminal and a drain electrode thereof connected with the second node,
the method comprising:
during a first time period, inputting a second pulse signal to a second input terminal connected with the second input module, and inputting a first clock signal to a third input terminal connected with the second input module to control the second input module to transmit the second pulse signal to the first node;
during a second time period, inputting a first pulse signal to the first input terminal to control the first transistor and the second transistor to be turned on such that the first transistor transmits a first level signal inputted to the fifth input terminal to the first node after turned on, and the second transistor transmits a second clock signal inputted to the fourth input terminal to the second node after turned on, and using the second clock signal at the second node to control the output module to output a fourth pulse signal;
during a third time period, using the first clock signal to control the second input module to transmit the second pulse signal to the first node, and using the second pulse signal at the first node control the output module to output the fourth pulse signal,
wherein the second pulse signal is opposite in phase during the first time period and during the second time period, the fourth pulse signal is opposite in phase during the second time period and during the third time period, and each of the first clock signal and the second clock signal is opposite in phase during the first time period, during the second time period, and during the third time period.

The first input module of the shift register provided by the present disclosure controls the level at the second node, which in turn controls the interconnection between the fifth input terminal and the first output terminal, such that the first level signal inputted to the fifth input terminal is output to the first output terminal and transmitted to the next stage shift register as an effective shift signal, thereby the next stage shift register operates normally. The shift register provided by the present embodiment is advantageous in stability, transmission performance, operation stability and performance, which may solve the problem of poor stability and operation instability of the shift register in the prior art.

BRIEF DESCRIPTION OF THE DRAWINGS

FIG. 1b is a corresponding driving timing diagram of the shift register in FIG. 1a;

FIG. 3b is a corresponding driving timing diagram of the shift register provided in FIG. 3a;

FIG. 5b is a corresponding driving timing diagram of the shift register provided in FIG. 5a;

DETAILED DESCRIPTION

Hereinafter, the present disclosure will be further described in detail with reference to the drawings and embodiments, such that the above objects, features and advantages will become more apparent.

It should be noted that, specific details are set forth in the following description for a full understanding of the present disclosure. However, the present disclosure may be embodied in various other ways different from those described herein, and those skilled in the art will come to similar generalizations without departing from the concept of the present disclosure. Accordingly, the present disclosure is not limited to the detailed embodiments disclosed below.

Figure 1A:
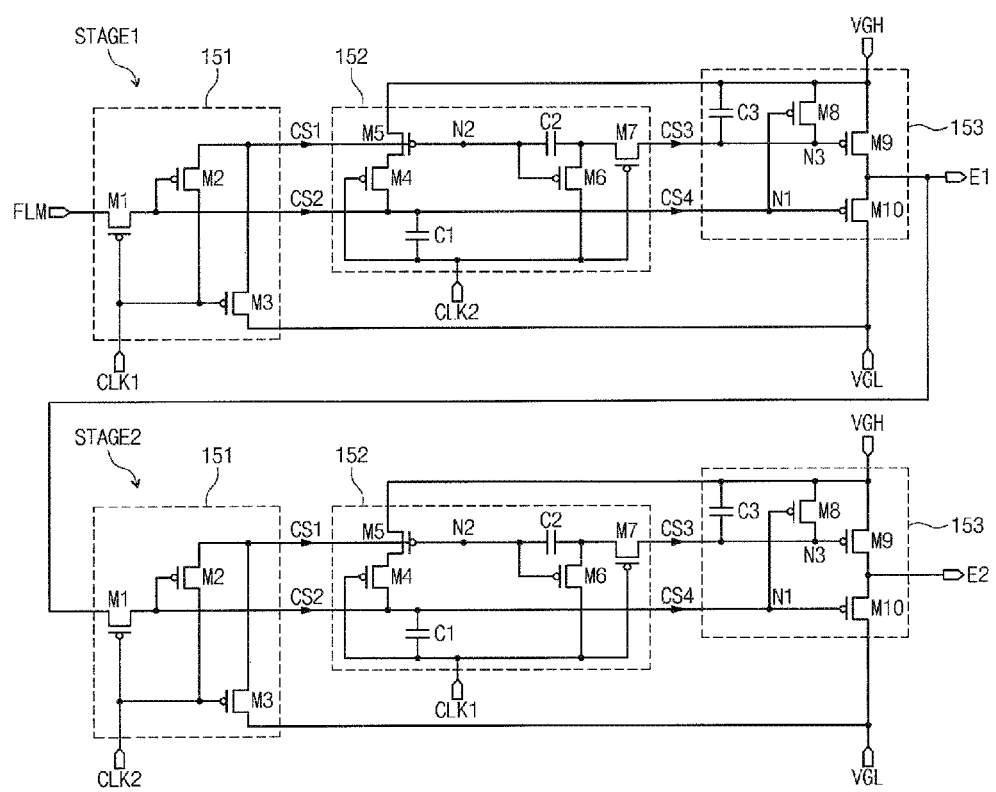
FIG. 1a is a schematic structural diagram illustrating a shift register in the prior art.
Figure 1B:
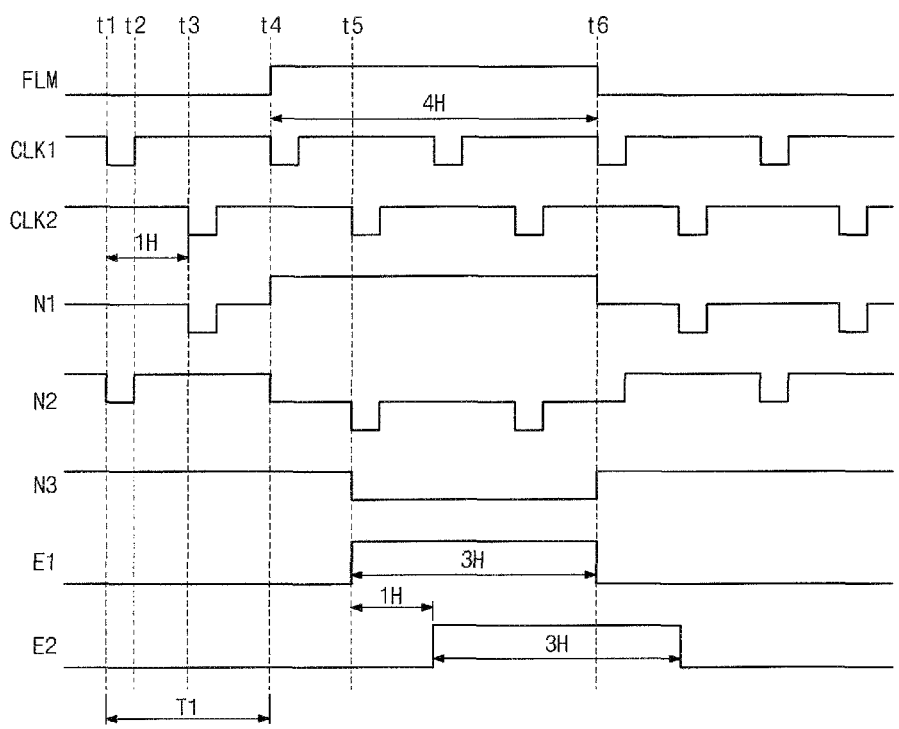
Figure 2:
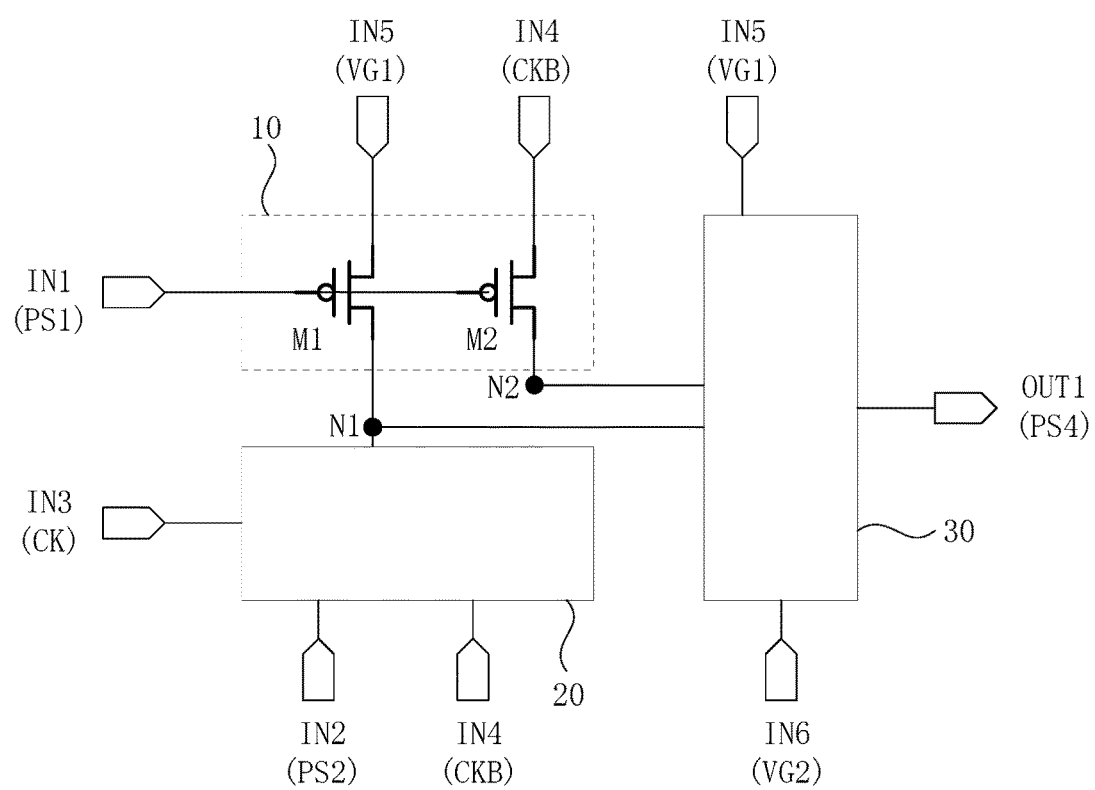
FIG. 2 is a schematic diagram illustrating a shift register provided by an embodiment of the present disclosure.

Referring to FIG. 2, which is a schematic diagram illustrating a shift register provided by an embodiment of the present disclosure. The shift register provided In this embodiment is adaptable to a situation for improving circuit stability. As illustrated in FIG. 2, the shift register provided In this embodiment includes: a first input module 10, a second input module 20 and an output module 30; and a first input terminal IN1, a second input terminal IN2, a third input terminal IN3, a fourth input terminal IN4, a fifth input terminal IN5, a sixth input terminal IN6 and a first output terminal OUT1. In this embodiment, a first pulse signal PS1 is inputted to the first input terminal IN1, a second pulse signal PS2 is inputted to the second input terminal IN2, a first clock signal CK is inputted to the third input terminal IN3, a second clock signal CKB is inputted to the fourth input terminal IN4 inputs, a first level signal VG1 is inputted to the fifth input terminal, and a second level signal VG2 is inputted to the sixth input terminal IN6.

Continuing referring to FIG. 2, In this embodiment, the first input module 10 includes a first transistor M1 and a second transistor M2. A gate electrode of the first transistor M1 is connected with the first input terminal IN1 to input the first pulse signal PS1, a source electrode of the first transistor M1 is connected with the fifth input terminal IN5, and a drain electrode of the first transistor M1 is connected with a first node N1. A gate electrode of the second transistor M2 is connected with the first input terminal IN1, a source electrode of the second transistor M2 is connected with the fourth input terminal IN4, and a drain electrode of the second transistor M2 is connected with a second node N2.

The second input module 20 is connected with the second input terminal IN2, the third input terminal IN3 and the fourth input terminal IN4, and the second input module 20 is electrically connected with the first input module 10 at the first node N1.

The output module 30 is connected with the fifth input terminal IN5, the sixth input terminal IN6 and the first output terminal OUT1. The output module 30 is electrically connected with the first input module 10 at the first node N1 and the second node N2. The output module 30 is electrically connected with the second input module 20 at the first node N1.

In this embodiment, the first transistor M1 and the second transistor M2 are P-type channel thin film transistors, and the first level signal VG1 has a level higher than that of the second level signal VG2. That is, in this embodiment, the second level signal VG2 has a level that controls the turning-on of the P-type channel thin film transistors. In other embodiments of the present disclosure, the first transistor M1 and the second transistor M2 may also be N-type channel thin film transistors, and the first level signal VG1 has a level lower than that of the second level signal VG2. In the N-type channel thin film transistors, the second level signal VG2 has a level that controls the turning-on of the N-type channel thin film transistors.

According to the above embodiment, the first transistor M1 of the first input module 10 and the second input module 20 keep the first node N1 at a low level or a high level under the control of the first pulse signal PS1 and the first level signal VG1, and under the control of the second pulse signal PS2, the first clock signal CK and the second clock signal CKB. Meanwhile, the second transistor M2 of the first input module 10 keeps the second node N2 at a low level or a high level under the control of the first pulse signal PS1 and the second clock signal CKB. While the output module 30 outputs a high level of the first level signal VG1 or a low level of the second level signal VG2 as the fourth pulse signal PS4 via the first output terminal OUT1 at different time, under the control of the first node N1 and the second node N2.

On the basis of the above technical solution, each of the second input module 20 and the output module 30 may be implemented in various circuit schemes, which are described herein as examples in the following embodiments. It should be understood that circuits of the second input module 20 and the output module 30 are not limited to the following embodiments, and they are implementable in many other combinations.

Figure 3A:
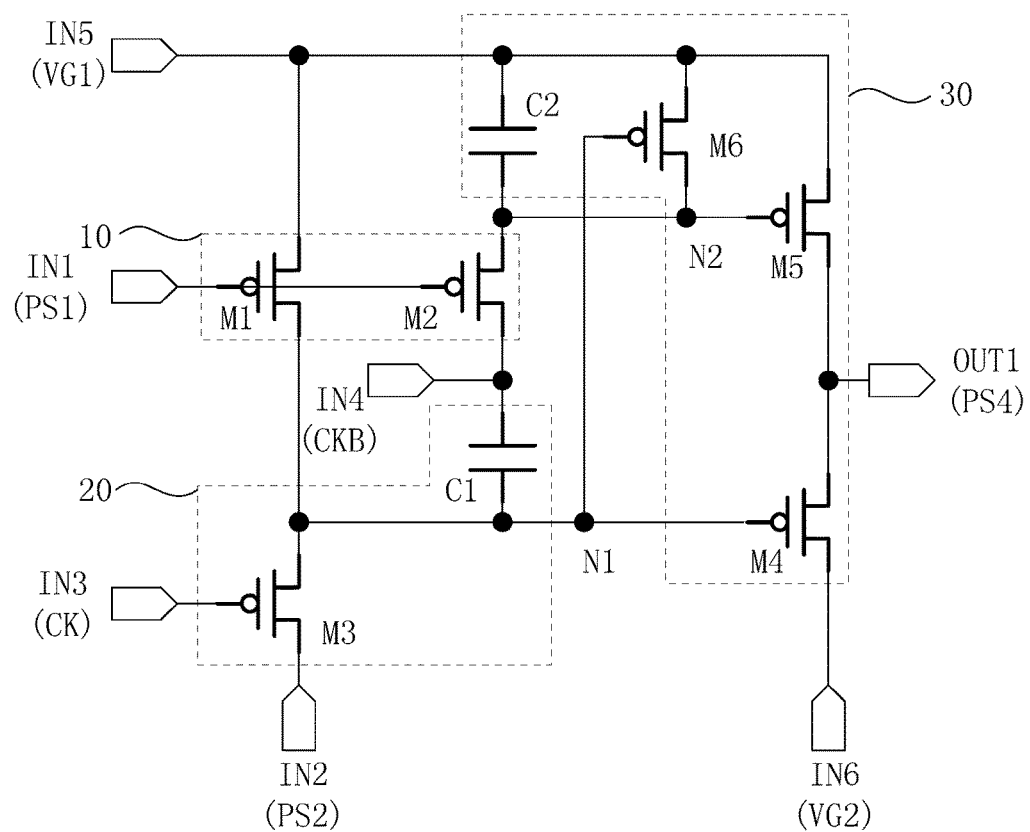
FIG. 3a is a schematic diagram illustrating a shift register provided by an embodiment of the present disclosure.

Referring to FIG. 3a, which is a schematic diagram illustrating a shift register provided by an embodiment of the present disclosure. On the basis of the shift register of FIG. 2, the shift register illustrated in FIG. 3a includes a first input module 10, a second input module 20 and an output module 30.

The first input module 10 includes a first transistor M1 and a second transistor M2. A gate electrode of the first transistor M1 is connected with the first input terminal IN1, a source electrode of the first transistor M1 is connected with the fifth input terminal IN5, and a drain electrode of the first transistor M1 is connected with the first node N1. A gate electrode of the second transistor M2 is connected with the first input terminal IN1, a source electrode of the second transistor M2 is connected with the fourth input terminal IN4, and a drain electrode of the second transistor M2 is connected with the second node N2.

The second input module 20 includes a third transistor M3 and a first capacitor C1. A gate electrode of the third transistor M3 is connected with the third input terminal IN3, a source electrode of the third transistor M3 is connected with the second input terminal IN2, and a drain electrode of the third transistor M3 is connected with the first node N1. The first capacitor C1 is connected between the first node N1 and the fourth input terminal IN4.

The output module 30 includes a fourth transistor M4, a fifth transistor M5, a sixth transistor M6 and a second capacitor C2. A gate electrode of the fourth transistor M4 is connected with the first node N1, a source electrode of the fourth transistor M4 is connected with the sixth input terminal IN6, and a drain electrode of the fourth transistor M4 is connected with the first output terminal OUT1. A gate electrode of the fifth transistor M5 is connected with the second node N2, a source electrode of the fifth transistor M5 is connected with the fifth input terminal IN5, and a drain electrode of the fifth transistor M5 is connected with the first output terminal OUT1. A gate electrode of the sixth transistor M6 is connected with the first node N1, a source electrode of the sixth transistor M6 is connected with the fifth input terminal IN5, and a drain electrode of the sixth transistor M6 is connected with the second node N2. The second capacitor C2 is connected between the second node N2 and the fifth input terminal IN5.

On the basis of the above structure, the first transistor M1, the second transistor M2, the third transistor M3, the fourth transistor M4, the fifth transistor M5 and the sixth transistor M6 are P-type channel thin film transistors. Accordingly, the first pulse signal PS1 inputted to the first input terminal IN1 has an effective driving signal portion of low level signal and an ineffective driving signal portion of high level signal. That is, the first pulse signal PS1 has different levels at different time periods. When it has a high level, it will not turn on the first transistor M1 and the second transistor M2 the gate electrodes of which connected therewith, and thus is an ineffective driving signal. When it has a low level, it will turn on the first transistor M1 and the second transistor M2 the gate electrodes of which connected therewith, and thus is an effective driving signal. In addition, the first pulse signal PS1 may be directly provided by a driving chip, or may be generated by other circuits, which is not intended to be limiting. Based on the above structure, the first level signal VG1 has a level higher than that of the second level signal VG2, i.e., the first level signal VG1 is a high level signal VGH, and the second level signal VG2 is a low level signal VGL.

According to the specific application scenario of the shift register, a signal that enables the shift may be a high level signal, or may be a low level signal. In this embodiment, the shift register is used to provide light emitting driving signal to an organic light emitting display (OLED) panel. Generally, in an OLED panel, the light emitting driving signal is a high level signal. Accordingly, in the shift register provided by the present embodiment, the second pulse signal PS2 inputted to the second input terminal IN2 is an effective shifting signal when it has a high level, and is outputted from a prior stage shift register to trigger an organic light emitting element connected to the prior stage shift register and to trigger a current stage shift register. The fourth pulse signal PS4 outputted from the first output terminal OUT1 of the current stage shift register is an effective shifting signal when it has a high level, and triggers an organic light emitting element connected to the current stage shift register and a next stage shift register. In this embodiment, the second pulse signal PS2 and the fourth pulse signal PS4 are ineffective driving signals when they are low level signals.

Figure 3B:
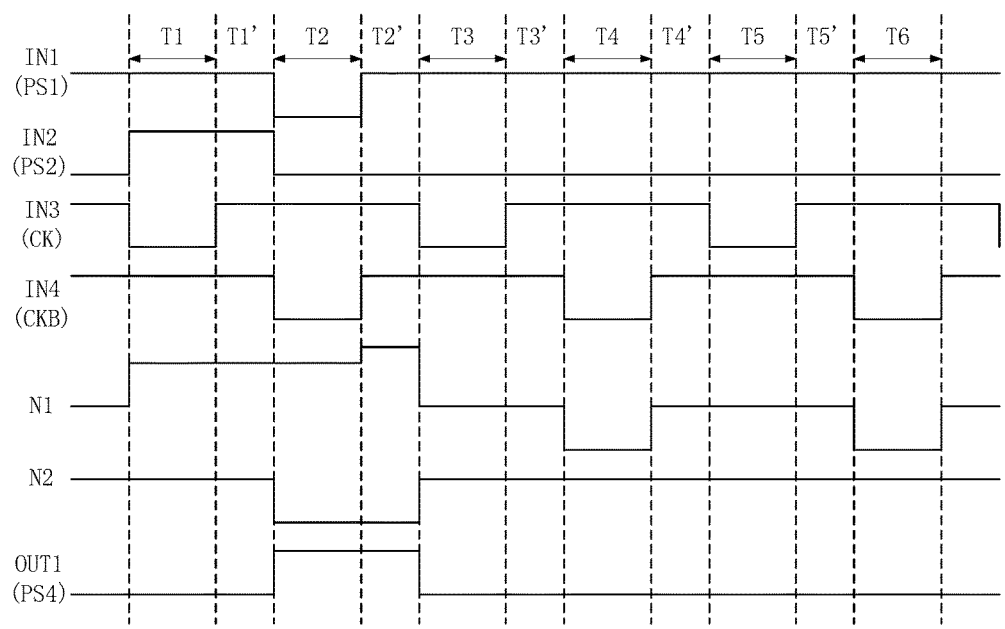

Referring to FIG. 3b, which is a corresponding driving timing diagram of the shift register provided in FIG. 3a.

During the first time period T1, the second input terminal IN2 connected to the second input module 20 inputs the second pulse signal PS2, and the first clock signal CK inputted to the third input terminal IN3 connected with the second input module 20 controls the second input module 20 to transmit the second pulse signal PS2 to the first node N1.

In detail, during the first time period T1, the first pulse signal PS1 inputted to the first input terminal IN1 is a high level signal VGH, which is an ineffective driving signal, and the first transistor M1 and the second transistor M2 connected with the first input terminal IN1 are not turned on.

In the second input module 20, the first clock signal CK inputted to the third input terminal IN3 is low, which controls the third transistor M3 to be turned on. The third transistor M3 transmits the second pulse signal PS2 to the first node N1, and the level of the first node N1 may be maintained during the first time period T1 with the effect of the first capacitor C1. At this time, the second pulse signal PS2 is a high level signal, which is an effective shifting signal, and the first node N1 maintains the level of the second pulse signal PS2 in a high level. That is, the first time period T1 is a signal input period.

In the output module 30, the high level signal maintained at the first node N1 controls the fourth transistor M4 and the sixth transistor M6 to be turned off. The second node N2 is maintained in a level of the first level signal VG1 inputted to the fifth input terminal IN5, that is, a high level, by the coupling of the second capacitor C2. The level of the second node N2 controls the fifth transistor M5 to be turned off. That is, the fourth transistor M4, the fifth transistor M5 and the sixth transistor M6 of the output module are turned off. No new signal is transmitted to the first output terminal OUT1, and the first output terminal OUT1 will maintain a signal after a resetting, that is, an ineffective shifting signal, i.e., a low level signal.

After the first time period T1, it comes to a first transition time period T1', during the first transition time period T1', input of the shift register is unchanged, and only the first clock signal CK is changed from the low level signal to a high level signal. At this time, as the second clock signal CKB is unchanged, which is still a high level signal, the first clock signal CK and the second clock signal CKB have the same phase.

During the first transition time period T1', the first clock signal CK switches from the low level signal to a high level signal, the third transistor M3 of the second input module 20 is turned off, and the node N1 has no new input signal, which remains the level of the first time period T1. With respect to other modules, as no signal input is changed, signals at each node and the output terminal are the same with those of the first time period T1, which remain unchanged.

During the second time period T2, the first pulse signal PS1 is inputted to the first input terminal IN1, which controls the first transistor M1 and the second transistor M2 to be turned on. The first transistor M1 transmits the first level signal VG1 inputted to the fifth input terminal IN5 to the first node N1, and the second transistor M2 transmits the second clock signal CKB inputted to the fourth input terminal IN4 to the second node N2. The second clock signal CKB at the second node N2 controls the output module 30 to output the fourth pulse signal.

In particular, during the second time period T2, the first pulse signal PS1 inputted to the first input terminal IN1 is a low level signal, which is an effective driving signal, such that the first transistor M1 and the second transistor M2 are turned on. Since the first level signal VG1 is a high level signal, the level of the first node N1 remains at a high level.

The second clock signal CKB switches from the high level of the first time period T1 to a low level during the second time period T2, thus the level of the second node is switched to the level of the second clock signal CKB, i.e., a low level, due to the effect of the second transistor M2.

During the second time period T2, the first clock signal CK is a high level signal, and the third transistor M3 of the second input module 20 is turned off.

In the output module 30, during the second time period T2, the first node N1 remains at a high level of the first level signal VG1 due to the effect of the first input module 10, and the second node N2 remains at a low level of the second clock signal CKB due to the effect of the first input module 10. The level of the first node N1 keeps the fourth transistor M4 and the sixth transistor M6 in a turned-off state. The level of the second node N2 controls the fifth transistor M5 to be turned on, and the fifth transistor M5 transmits the first level signal VG1 inputted to the fifth input terminal IN5 to the first output terminal OUT1. Since the first level signal VG1 is a high level signal, at this time, the output signal of the first output terminal OUT1 is a high level signal, which is an effective shifting signal. That is, the second time period T2 is a signal output period.

After the second time period T2, it comes to a second transition time period T2', during which the first pulse signal PS1 switches from the low level signal to a high level signal, and the second clock signal CKB switches from a low level signal to a high level signal. At this time, since the first pulse signal PS1 becomes an ineffective driving signal, the first transistor M1 is turned off. At this time, since the first clock signal CK remains as a high level signal, the third transistor M3 is also in a turned-off stage. The first node N1 has no signal input since the first transistor M1 and the third transistor M3 are both turned off, and under the coupling effect of the first capacitor C1, the level of the first node N1 is pulled up to a level of the second clock signal CKB inputted to another electrode of the first capacitor C1, such that the level of the first node N1 becomes higher than the level of a high level signal. Other nodes and the output of the shift register are unchanged. During the second transition time period T2', the first clock signal CK and the second clock signal CKB have the same phase.

During the third time period T3, the first clock signal CK controls the second input module 20 to transmit the second pulse signal PS2 to the first node N1, and the second pulse signal PS2 at the first node N1 controls the output module to output the fourth pulse signal PS4.

In particular, during the third time period T3, the first pulse signal PS1 is an ineffective driving signal and a low level signal, and at this time the first transistor M1 and the second transistor M2 are turned off. The first clock signal CK is low, which controls the third transistor M3 to be turned on. At this time, the second pulse signal PS2 is a low level signal, and the low level signal is transmitted to the first node N1 via the third transistor M3. Under the effect of the first capacitor C1, the level of the first node N1 is maintained during the third time period T3, which is the low level signal of the second pulse signal PS2.

During the third time period T3, the first node N1 maintains the level of the second pulse signal PS2 inputted to the second input terminal IN2 due to the effect of the second input module 20. The level of the first node N1 controls the fourth transistor M4 and the sixth transistor M6 to be turned on. The fourth transistor M4 transmits the second level signal VG2 inputted to the sixth input terminal IN6 to the first output terminal OUT1. The sixth transistor M6 transmits the first level signal VG1 to the second node N2, and the second node N2 maintains the level of the first level signal VG1 and controls the fifth transistor M5 to be turned off. Since the second level signal VG2 is a low level signal, the signal outputted from the first output terminal OUT1 is a low level signal, which is an ineffective shifting signal, such that the signal output of the output module 30 is reset. That is, the third time period T3 is a signal resetting period.

After the third time period T3, it comes to a third transition time period T3', during which the first clock signal CK is switched from low to high, the third transistor M3 is turned off, the first node N1 maintains a level of the previous period, and other nodes and the output are unchanged.

During the fourth time period T4, the second clock signal CKB is switched from high to low, the first node N1 is maintained at a low level of the second clock signal CKB due to the coupling effect of the first capacitor C1, the fourth transistor M4 and the sixth transistor M6 are turned on, the fourth transistor M4 transmits the low level signal of the second level signal VG2 to the first output terminal OUT1, the sixth transistor M6 updates the level of the second node N2 such that the second node N2 maintains at a high level of the first level signal VG1, and the fifth transistor M5 is turned off After the fourth time period T4, it comes to a fourth transition time period T4', the second clock signal CKB is switched from low to high, and the level of the first node N1 is pulled down to the level of a low level signal.

In the following periods, the level of the first node N1 will be continuously switched between the low level signal and the second clock signal CKB that is lower than the low level signal, and maintain that the first output terminal outputs a low level signal, till a signal output period of the next cycle.

The shift register provided by the present embodiment is advantageous in stability, transmission performance, operation stability and performance, which may solve the problem of poor stability and operation instability of the shift register in the prior art.

It should be noted that In this embodiment, the first time period T1 is a signal input period, the second time period T2 is a signal output period, the third time period T3 is a signal reset period, and the second pulse signal PS2 has a high level during the first time period T1 and has a low level during the second time period T2, i.e., the second pulse signal PS2 is opposite in phase during the first time period T1 and the second time period T2. Similarly, the fourth pulse signal PS4 is opposite in phase during the second time period T2 and the third time period T3. The first clock signal CK and the second clock signal CKB are opposite in phase during the first time period T1, the second time period T2 and the third time period T3. The first transition time period T1', the second transition time period T2' and the third transition time period T3' are transition time periods of the clock signals during which the first clock signal CK and the second clock signal CKB are identical in phase. In other embodiments of the present disclosure, transition time periods may be omitted without influencing the operation of the shift register.

In addition, in other embodiments, the first transistor M1, the second transistor M2, the third transistor M3, the fourth transistor M4, the fifth transistor M5 and the sixth transistor M6 may be N-type channel thin film transistors, and the first level signal is lower than the second level signal. In addition, effective driving level and ineffective driving level of the first pulse signal are opposite to those In this embodiment, and the effective shifting level and ineffective shifting level of the second pulse signal and the fourth pulse signal are also opposite to those of the present embodiment. The operating principle is the same as that of the present embodiment, which will not be repeated herein.

Figure 4:
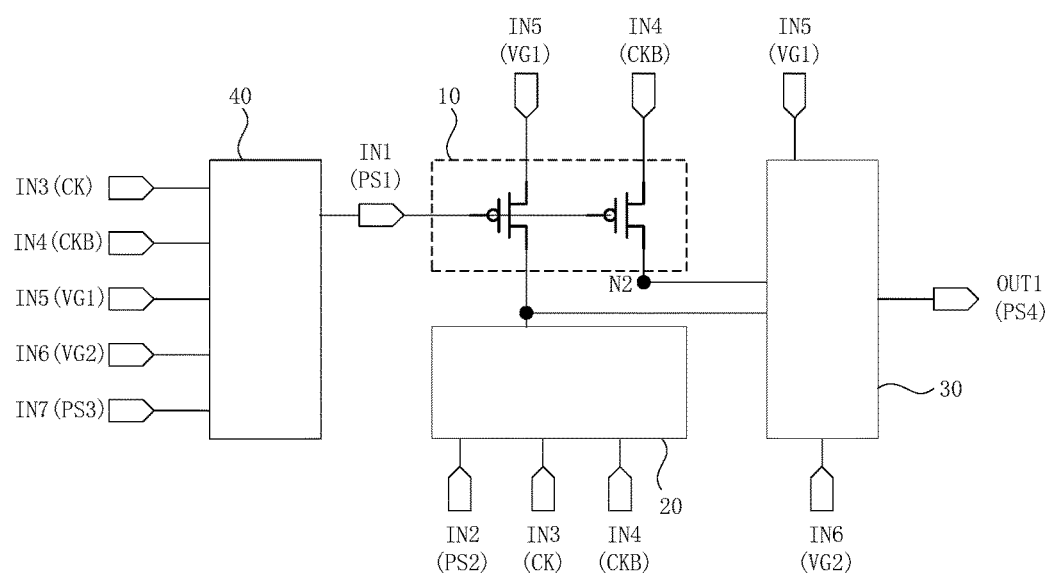
FIG. 4 is a schematic diagram illustrating another shift register provided by an embodiment of the present disclosure.

Referring to FIG. 4, which is a schematic diagram illustrating another shift register provided by an embodiment of the present disclosure. The shift register provided In this embodiment is adaptable to a situation for improving circuit stability. As illustrated in the drawing, the shift register provided In this embodiment includes: a first input module 10, a second input module 20, a third input module 40 and an output module 30; and a first input terminal IN1, a second input terminal IN2, a third input terminal IN3, a fourth input terminal IN4, a fifth input terminal IN5, a sixth input terminal IN6, a seventh input terminal IN7 and a first output terminal OUT1. In this embodiment, the first input terminal IN1 serves as both a signal output terminal of the third input module 40 and a signal input terminal of the first input module 10. The first pulse signal PS1 is inputted to the first input module 10 from the third input module 40, the second input terminal IN2 inputs the second pulse signal PS2, the third input terminal IN3 inputs the first clock signal CK, the fourth input terminal IN4 inputs the second clock signal CKB, the fifth input terminal inputs the first level signal VG1, the sixth input terminal IN6 inputs the second level signal VG2, and the seventh input terminal IN7 inputs the third pulse signal PS3.

In the embodiment shown in FIG. 4, the first input module 10, the second input module 20 and the output module 30 have the same input/output connection and interconnection therebetween with those In this embodiment illustrated in FIG. 2, which may refer to the corresponding description and are not repeated herein. Hereinafter, detailed description is made on the differences therebetween.

Continuing referring to FIG. 4, the third input module 40 is connected with the third input terminal IN3, the fourth input terminal IN4, the fifth input terminal IN5, the sixth input terminal IN6, the seventh input terminal IN7 and the first input terminal IN1. The third pulse signal is inputted to the seventh input terminal IN7 as an activation signal of the third input module 40. The first input terminal IN1 serves as the output terminal of the third input module 40 to output the first pulse signal PS1 to the first input module 10.

Similarly, in this embodiment, the first transistor M1 and the second transistor M2 are P-type channel thin film transistors, and the first level signal VG1 has a level higher than that of the second level signal VG2. That is, In this embodiment, the level of the second level signal VG2 is a level that controls the P-type channel thin film transistor to be turned on. In other embodiments, the first transistor M1 and the second transistor M2 may also be N-type channel thin film transistors, and the first level signal VG1 has a level lower than that of the second level signal VG2. In the N-type channel thin film transistor, the level of the second level signal VG2 is a level that controls the thin film transistor to be turned on.

In this embodiment, the third input module 40 provides the first pulse signal PS1 to the first input module 10 as a driving signal, under the control of the first clock signal CK inputted to the third input terminal IN3, the second clock signal CKB inputted to the fourth input terminal IN4, the first level signal VG1 inputted to the fifth input terminal IN5, the second level signal VG2 inputted to the sixth input terminal IN6 and the third pulse signal PS3 inputted to the seventh input terminal IN7. The first transistor M1 of the first input module 10 and the second input module 20 keep the first node N1 at a low level or a high level under the control of the first pulse signal PS1 and the first level signal VG1, and under the control of the second pulse signal PS2, the first clock signal CK and the second clock signal CKB. Meanwhile, the second transistor M2 of the first input module 10 keeps the second node N2 at a low level or a high level under the control of the first pulse signal PS1 and the second clock signal CKB. While the output module 30 outputs a high level of the first level signal VG1 or a low level of the second level signal VG2 as the fourth pulse signal PS4 via the first output terminal OUT1 at different time, under the control of the first node N1 and the second node N2.

On the basis of the above technical solution, each of the second input module 20, the third input module 40, and the output module 30 may be implemented in various circuit schemes, which are described as examples in the following embodiments. However, circuits of the second input module 20, the third input module 40 and the output module 30 provided by the present disclosure are not limited to the following embodiments, and they are implementable in many other combinations.

Figure 5A:
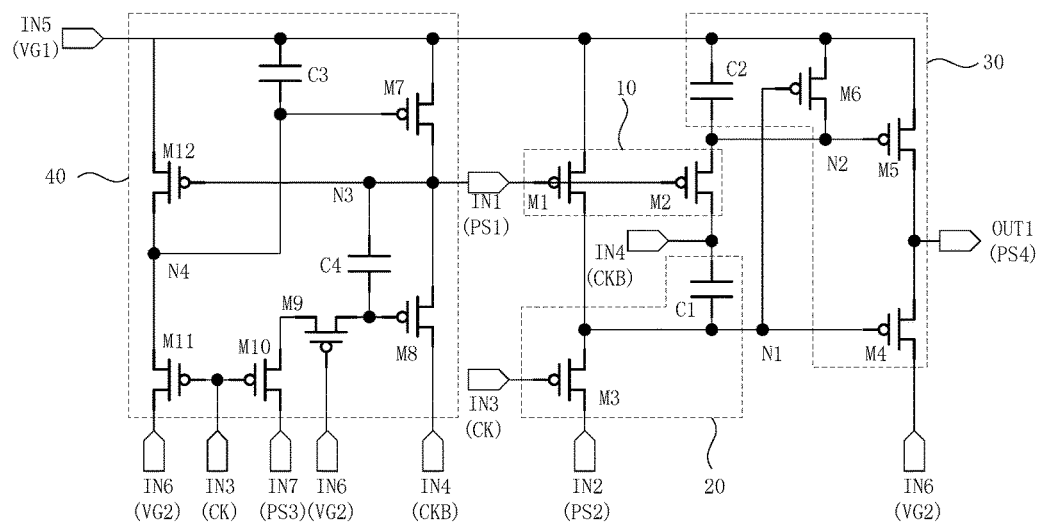
FIG. 5a is a schematic diagram illustrating a shift register provided by an embodiment of the present disclosure.

Referring to FIG. 5a, which is a schematic diagram illustrating a shift register provided by an embodiment of the present disclosure. On the basis of the shift register of FIG. 4, the shift register illustrated in FIG. 5a includes a first input module 10, a second input module 20, a third input module 40, and an output module 30.

In this embodiment, the first input module 10, the second input module 20 and the output module 30 include the same elements as those illustrated in FIG. 3a. Please refer to FIG. 3a for description of those components, which is not repeated herein. Referring to FIG. 5a, in this embodiment, the third input module 40 includes a seventh transistor M7, an eighth transistor M8, a ninth transistor M9, a tenth transistor M10, a eleventh transistor M11, a twelfth transistor M12, a third capacitor C3 and a fourth capacitor C4.

In particular, a gate electrode of the seventh transistor M7 is connected with a drain electrode of the twelfth transistor M12 at a fourth node N4, a source electrode of the seventh transistor M7 is connected with the fifth input terminal IN5 to receive the first level signal VG1, and a drain electrode of the seventh transistor M7 is connected with the first input terminal IN1 to output the first pulse signal PS1 to the first input terminal IN1. A gate electrode of the eighth transistor M8 is connected with a drain electrode of the ninth transistor M9, a source electrode of the eighth transistor M8 is connected with the fourth input terminal IN4 to receive the second clock signal CKB, and a drain electrode of the eighth transistor M8 is connected with the first input terminal IN1. A gate electrode of the ninth transistor M9 is connected with the sixth input terminal IN6 to receive the second level signal VG2, and a source electrode of the ninth transistor M9 is connected with a drain electrode of the tenth transistor M10. A gate electrode of the tenth transistor M10 is connected with the third input terminal IN3 to receive the first clock signal CK, and a source electrode of the tenth transistor M10 is connected with the seventh input terminal IN7 to receive the third pulse signal PS3. A gate electrode of the eleventh transistor M11 is connected with the third input terminal IN3 to receive the first clock signal CK, a source electrode of the eleventh transistor M11 is connected with the sixth input terminal IN6 to receive the second level signal VG2, and a drain electrode of the eleventh transistor M11 is connected with the fourth node N4. A gate electrode of the twelfth transistor M12 is connected with the first input terminal IN1, and a source electrode of the twelfth transistor M12 is connected with the fifth input terminal IN5 to receive the first level signal VG1. The third capacitor C3 is connected between the gate electrode of the eighth transistor M8 and the first input terminal IN1, and the third capacitor C3 is connected with the first input terminal IN1 at the third node N3. The fourth capacitor C4 is connected between the gate electrode of the seventh transistor M7 and the fifth input terminal IN5.

On the basis of the above structure, transistors included in each module are P-type channel thin film transistors. Accordingly, the first pulse signal PS1 inputted to the first input terminal IN1 has an effective driving signal portion of low level signal and an ineffective driving signal portion of high level signal. That is, the first pulse signal PS1 has different levels at different time periods. When it has a high level, it will not turn on the first transistor M1 and the second transistor M2 the gate electrodes of which connected therewith, and thus is an ineffective driving signal. When it has a low level, it will turn on the first transistor M1 and the second transistor M2 the gate electrodes of which connected therewith, and thus is an effective driving signal. The third pulse signal PS3, as a driving signal of the third input module, is an effective driving signal at a low level and an ineffective driving signal at a high level. In addition, based on the above structure, the first level signal VG1 has a level higher than the second level signal VG2, i.e., the first level signal VG1 is a high level signal VGH, and the second level signal VG2 is a low level signal VGL.

According to the specific application scenario of the shift register, a signal that enables the shift may be a high level signal, or may be a low level signal. In this embodiment, the shift register is used to provide light emitting driving signal to an organic light emitting display (OLED) panel. Generally, in an OLED panel, the light emitting driving signal is a high level signal. Accordingly, in the shift register provided by the present embodiment, the second pulse signal PS2 inputted to the second input terminal IN2 is an effective shifting signal when it has a high level, and is outputted from a prior stage shift register to trigger an organic light emitting element connected to the prior stage shift register and to trigger a current stage shift register. The fourth pulse signal PS4 outputted from the first output terminal OUT1 of the current stage shift register is an effective shifting signal when it has a high level, and triggers an organic light emitting element connected to the current stage shift register and a next stage shift register. In this embodiment, the second pulse signal PS2 and the fourth pulse signal PS4 are ineffective driving signals when they are low level signals.

Figure 5B:
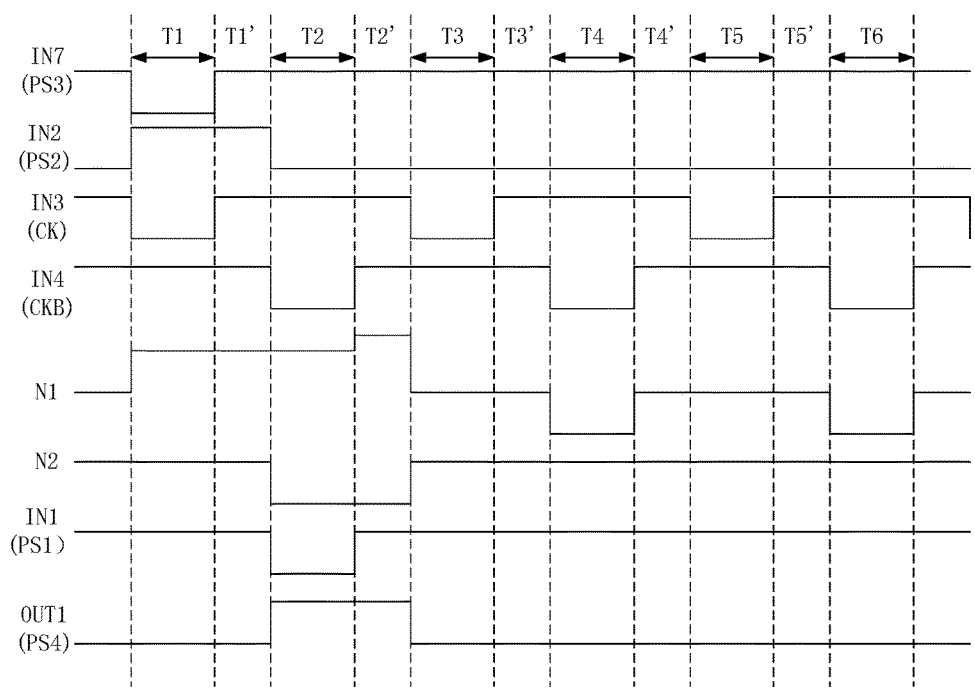

Referring to FIG. 5b, which is a corresponding driving timing diagram of the shift register provided in FIG. 5a.

Interconnection and signal input of the first input module 10, the second input module 20 and the output module 30 are the same as those illustrated in FIG. 3a. Thus input and output waveforms of the first input module 10, the second input module 20 and the output module 30 at each node during each time period are the same as those of FIG. 3a, which will not be repeated herein.

During the first time period T1, the seventh input terminal IN7 inputs the third pulse signal PS3, which is a low level signal and an effective driving signal during said period. At this time, the first clock signal CK is low, and the tenth transistor M10 and the eleventh transistor M11 are turned on. The second level signal VG2 is a low level signal, and the ninth transistor M9 is turned on. The third pulse signal PS3 is transmitted to the gate electrode of the eighth transistor M8 via the tenth transistor M10 and the ninth transistor M9, and at this time, as the third pulse signal PS3 is a low level signal, the eighth transistor M8 is turned on. The second clock signal CKB is transmitted to the first input terminal IN1, and since the second clock signal CKB is at high level, the first pulse signal PS1 outputted from the first input terminal IN1 is at high level, which is an ineffective driving signal that disables the operation of the first transistor M1 and the second transistor M2 of the first input module 10. Meanwhile, the second level signal VG2 is transmitted to the fourth node via the eleventh transistor M11 and controls the seventh transistor M7 to be turned on. The first level signal VG1 inputted at the fifth input terminal IN5 is transmitted to the first input terminal IN1, and since the first level signal VG1 is a high level signal, output of the first input terminal IN1 is not affected.

During the second time period T2, the first clock signal CK is high, the second clock signal CKB is low, and the third pulse signal PS3 is a high level signal. The tenth transistor M10, the eleventh transistor M11 are turned off, and the gate electrode of the eighth transistor M8 is kept at a low level of the first time period T1. Accordingly, the eighth transistor M8 is turned on and the second clock signal CKB is transmitted to the first input terminal IN1. Since the second clock signal CKB is low, the first pulse signal PS1 outputted from the first input terminal IN1 is at low level, which is an effective driving signal. The level of the node N3, i.e., the output level of the first input terminal IN1 at this time, is at low level, and thus the twelfth transistor M12 is turned on. The first level signal VG1 inputted to the fifth input terminal IN5 is transmitted to the fourth node N4, and the level of the fourth node N4 is maintained at the level of the first level signal VG1, which is a high level signal. The level of the fourth node N4 controls the seventh transistor M7 to be turned off During the third time period T3, the first clock signal CK is low, the second clock signal CKB is high, and the third pulse signal PS3 is a high level signal. In the following time periods, the third pulse signal PS3 maintains the high level until a low level signal is inputted at the next cycle. During the third time period T3, the tenth transistor M10 and the eleventh transistor M11 are turned on, the fourth node N4 is switched low, the seventh transistor M7 is turned on, and the first input terminal IN1 outputs the first level signal VG1 which is a high level signal. The gate electrode of the eighth transistor M8 is at high level, and thus the eighth transistor M8 is turned off. The third input module 40 is reset.

In the following time periods, whenever the first clock signal CK is switched low, the level of the fourth node N4 is switched low and the level of the gate electrode of the eighth transistor M8 is switched high, thereby ensuring a high level output of the first input terminal IN1.

Similarly, between respective time periods, respective transition time periods are included, and the first clock signal CK and the second clock signal CKB have the same phase during the transition time periods.

The shift register provided by the present embodiment is advantageous in stability, transmission performance, operation stability and performance, which may solve the problem of poor stability and operation instability of the shift register in the prior art.

In addition, in other embodiments, the transistors included in each module may be an N-type channel thin film transistors, and the first level signal is lower than the second level signal. In addition, effective driving level and ineffective driving level of the first pulse signal and the third pulse signal are opposite to those in this embodiment. The effective shifting level and ineffective shifting level of the second pulse signal and the fourth pulse signal are also opposite in phase to those of the present embodiment. The operating principle is the same as that of the present embodiment, which will not be repeated herein.

Figure 6:
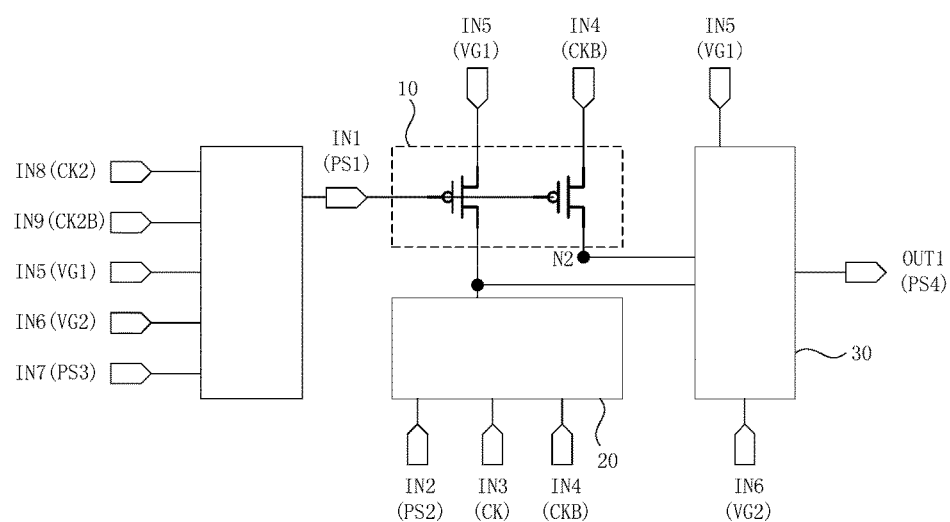
FIG. 6 is a schematic diagram illustrating another shift register provided by an embodiment of the present disclosure.

Referring to FIG. 6, which is a schematic diagram illustrating another shift register provided by an embodiment of the present disclosure. The shift register provided In this embodiment is adaptable to a situation for improving circuit stability. As illustrated in the drawing, the shift register provided in this embodiment includes: a first input module 10, a second input module 20, a third input module 40 and an output module 30; and a first input terminal IN1, a second input terminal IN2, a third input terminal IN3, a fourth input terminal IN4, a fifth input terminal IN5, a sixth input terminal IN6, a seventh input terminal IN7, an eighth input terminal IN8, a ninth input terminal IN9, and a first output terminal OUT1. In this embodiment, the first input terminal IN1 serves as both a signal output terminal of the third input module 40 and a signal input terminal of the first input module 10. The first pulse signal PS1 is inputted to the first input module 10 from the third input module 40, the second pulse signal PS2 is inputted to the second input terminal IN2, the first clock signal CK is inputted to the third input terminal IN3, the second clock signal CKB is inputted to the fourth input terminal IN4, the first level signal VG1 is inputted to the fifth input terminal, the second level signal VG2 is inputted to the sixth input terminal IN6, the third pulse signal PS3 is inputted to the seventh input terminal IN7, a third clock signal CK2 is inputted to the eighth input terminal IN8, and a fourth clock signal CK2B is inputted to the ninth input terminal IN9. In this embodiment, the first clock signal CK and the second clock signal CKB have a first phase changing period t1, and the third clock signal CK2 and the fourth clock signal CK2B have a second phase changing period t2, wherein t1=2*t2.

On the basis of the above technical solution, each of the second input module 20, the third input module 40, and the output module 30 may be implemented in various circuit schemes. In this embodiment, a circuit structure which is the same as that of FIG. 5a is employed, and only the first clock signal CK and the second clock signal CKB connected with the third input module 40 are changed to the third clock signal CK2 and the fourth clock signal CK2B. Detailed structures thereof may be referred with corresponding description in connection with FIG. 5a and are not repeated.

Figure 7:
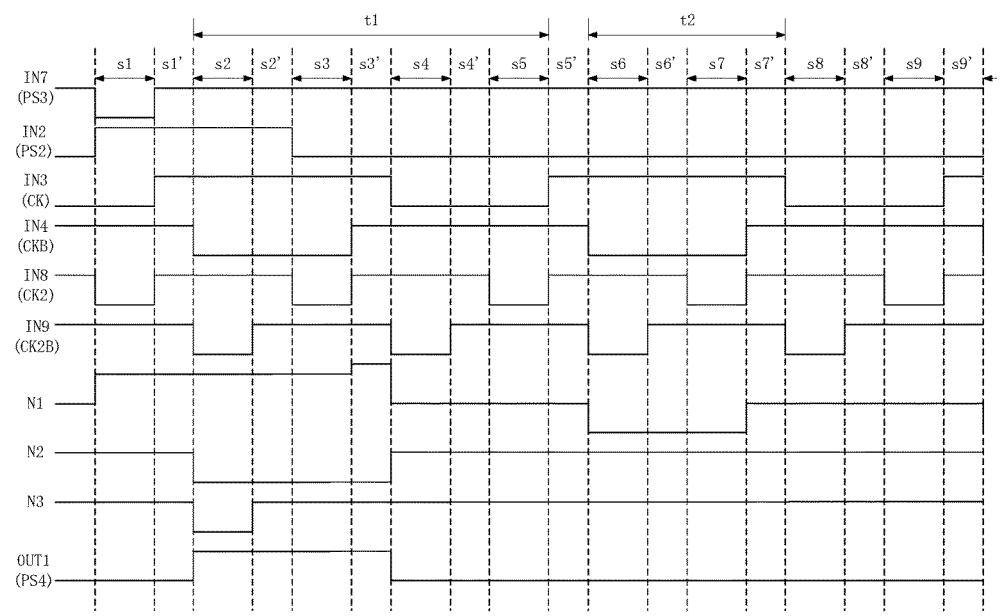
FIG. 7 is a corresponding driving timing diagram of the shift register provided in FIG. 6.

Referring to FIG. 7, which is a corresponding driving timing diagram of the shift register provided in FIG. 6. Time is divided into time periods s1, s2, s3 . . . , and respective transition time periods s1', s2', s3' . . . are provided between respective time periods.

With respect to the third input module 40, the timing changings of the third clock signal CK2 and the fourth clock signal CK2B connected therewith are the same as those of the first clock signal CK and the second clock signal CKB as illustrated in FIG. 5b. Accordingly, with respect to the third input module 40, its input and output are the same as those of the embodiments provided in FIGS. 5a and 5b, which may refer to the corresponding description and are not repeated herein.

With respect to the first input module 10, the second input module 20 and the output module 30, comparing with the embodiments provided in FIGS. 3a and 3b, phase changing time of the first clock signal CK and the second clock signal CKB is doubled, and the effective shifting time of the second pulse signal PS2 inputted to the second input terminal IN2 is also doubled. Accordingly, with respect to the first input module 10, the second input module 20 and the output module 30, their driving principles are the same as those of the shift register provided in FIGS. 3a and 3b.

The time period s1 constitutes the first time period T1. The second pulse signal PS2 inputted to the second input terminal IN2 connected with the second input module 20 is high, and the first clock signal CK inputted to the third input terminal IN3 connected with the second input module 20 controls the second input module to transmit the second pulse signal PS2 to the first node N1. The first pulse signal PS1 inputted to the first input terminal IN1 is a high level signal, and the first transistor M1 and the second transistor M2 of the first input module 10 are turned off, and the second node N2 maintains at a high level after reset. The levels of the first node N1 and the second node N2 keep the output module 30 to be connected with neither of the first level signal VG1 or the second level signal VG2, and the first output terminal OUT1 outputs an ineffective shifting signal after reset, i.e., a low level signal.

Time periods s2, s2' and s3 constitute the second time period T2. During the front period s2 of the second time period T2, the first pulse signal PS1 is inputted to the first input terminal IN1. PS1 at this time is a low level signal and an effective driving signal that controls the first transistor M1 and the second transistor M2 to be turned on. The first transistor transmits the first level signal VG1 inputted to the fifth input terminal to the first node N1, and since the first level signal is a high level signal, the first node N1 maintains at a high level. The second transistor M2 transmits the second clock signal inputted to the fourth input terminal IN4 to the second node N2, and since at this time the second clock signal CKB is low, the second node N2 is at low level. The second clock signal CKB at the second node N2 controls the output module 30 to be connected to the first level signal VG1. The first output terminal OUT1 outputs the fourth pulse signal PS4, which at this time is a high level signal and an effective shifting signal. The latter periods s2' and s3 of the second time period T2, the first pulse signal PS1 is switched to high level, and other nodes and inputs remain unchanged. The first transistor M1 and the second transistor M2 are turned off, the first node N1 and the second node N2 maintain the states during the front period s2, the turned-on state of the output module 30 remains unchanged, and the fourth pulse signal PS4 outputted from the first output terminal OUT1 is still a high level effective shifting signal.

The time periods s4, s4' and s5 constitute the third time period T3 during which the first clock signal CK is low, the second clock signal CKB is high, the first pulse signal PS1 is a high level signal, and the second pulse signal PS2 is a low level signal. The first clock signal CK controls the second input module 20 to transmit the second pulse signal PS2 to the first node N1. The second pulse signal PS2 at the first node N1 controls the output module 30 to be connected with the second level signal VG2, the output module 30 outputs the fourth pulse signal PS4, which during this time period is a low level ineffective shifting signal.

In this embodiment, the first transition time period T1' and the second transition time period T2' are further included. In this embodiment, the first transition time period T1' is a transition time period s1', and the first transition time period T1' is provided between the first time period T1 and the second time period T2. The second transition time period T2' is a transition time period s3', and the second transition time period T2' is provided between the second time period T2 and the third time period T3. The first clock signal CK and the second clock signal CKB are identical in phase during the first transition time period T1' and the second transition time period T2'.

The shift register provided In this embodiment may simultaneously provide a gate driving signal and a light emitting signal to an organic light emitting display panel. In one embodiment, the first pulse signal PS1 transmitted at the first input terminal IN1 severs as the driving signal of the first input module 10, while also drives the gate electrode of the organic light emitting element connected with the present stage shift register, that is, the first pulse signal serves as the gate driving signal. Meanwhile, the fourth pulse signal servers as the light emitting driving signal of the organic light emitting element. That is, the shift register provided In this embodiment may satisfy simultaneously the gate driving and the light emitting driving without separately providing a gate driving circuit and a light emitting driving circuit. A process employing both circuits in the prior art is thus simplified, which is advantageous in saving elements. The shift register provided by the present embodiment is advantageous in stability, transmission performance, operation stability and performance, which may solve the problem of poor stability and operation instability of the shift register in the prior art.

In addition, in other embodiments of the present disclosure, the transistors included in each module may be an N-type channel thin film transistors, and at this time the first level signal is lower than the second level signal. In addition, effective driving level and ineffective driving level of the first pulse signal and the third pulse signal are opposite to those In this embodiment, and the effective shifting level and ineffective shifting level of the second pulse signal and the fourth pulse signal are also opposite to those of the present embodiment. The operating principle is the same as that of the present embodiment, which will not be repeated herein.

The above contents are further detailed descriptions of the present disclosure with reference to detailed preferred embodiments, which are not intended to limit the implementations of the present disclosure to the above description. To those skilled in the art, various simple deductions or substations are possible without departing from the concept of the present disclosure, all of which are intended to be included in the scope of the claimed invention.

What is claimed is:

1. A shift register, comprising:
   a first input module, a second input module and an output module; and
   a first input terminal, a second input terminal, a third input terminal, a fourth input terminal, a fifth input terminal, a sixth input terminal and a first output terminal, wherein a first pulse signal is inputted to the first input terminal, a second pulse signal is inputted to the second input terminal, a first clock signal is inputted to the third input terminal, a second clock signal is inputted to the fourth input terminal, a first level signal is inputted to the fifth input terminal, and a second level signal is inputted to the sixth input terminal being; and, wherein
   the first input module comprises a first transistor and a second transistor, a gate electrode of the first transistor being connected with the first input terminal, a source electrode of the first transistor being connected with the fifth input terminal, a drain electrode of the first transistor being connected with a first node, a gate electrode of the second transistor being connected with the first input terminal, a source electrode of the second transistor being connected with the fourth input terminal, and a drain electrode of the second transistor being connected with a second node,
   the second input module being connected with the second input terminal, the third input terminal and the fourth input terminal, and the second input terminal being electrically connected with the first input module at the first node, and
   the output module being connected with the fifth input terminal, the sixth input terminal and the first output terminal, the output module being electrically connected with the first input module at the first node and the second node, and the output module being electrically connected with the second input module at the first node.

2. The shift register of claim 1, wherein the second input module comprises a third transistor and a first capacitor, wherein a gate electrode of the third transistor is connected with the third input terminal, a source electrode of the third transistor is connected with the second input terminal, a drain electrode of the third transistor is connected with the first node, and the first capacitor is connected between the first node and the fourth input terminal.

3. The shift register of claim 1, wherein the output module comprises a fourth transistor, a fifth transistor, a sixth transistor and a second capacitor, wherein a gate electrode of the fourth transistor is connected with the first node, a source electrode of the fourth transistor is connected with the sixth input terminal, a drain electrode of the fourth transistor is connected with the first output terminal, a gate electrode of the fifth transistor is connected with the second node, a source electrode of the fifth transistor is connected with the fifth input terminal, a drain electrode of the fifth transistor is connected with the first output terminal, a gate electrode of the sixth transistor is connected with the first node, a source electrode of the sixth transistor is connected with the fifth input terminal, a drain electrode of the sixth transistor is connected with the second node, and the second capacitor is connected between the second node and the fifth input terminal.

4. The shift register of claim 1, further comprising a third input module and a seventh input terminal, wherein:
   the third input module is connected with the third input terminal, the fourth input terminal, the fifth input terminal, the sixth input terminal, the seventh input terminal and the first input terminal;
   the seventh input terminal is inputted with a third pulse signal; and
   the first input terminal serves as an output terminal of the third input module, to output the first pulse signal to the first input module.

5. The shift register of claim 1, further comprising a third input module, a seventh input terminal, an eighth input terminal, a ninth input terminal and a second output terminal, wherein:
   the third input module is connected with the fifth input terminal, the sixth input terminal, the seventh input terminal, the eighth input terminal, the ninth input terminal and the second output terminal;
   the seventh input terminal is inputted with a third pulse signal, the eighth input terminal is inputted with a third clock signal, and the ninth input terminal is inputted with a fourth clock signal; and
   the second output terminal is electrically connected with the first input terminal at a third node, to output the first pulse signal to the first input module.

6. The shift register of claim 5, wherein the first clock signal and the second clock signal have a first phase changing period t1, and the third clock signal and the fourth clock signal have a second phase changing period t2, wherein $t1 = 2 \times t2$.

7. The shift register of claim 1, comprising a plurality of transistors, the plurality of transistors are P-type channel thin film transistors, and the first level signal having a level higher than that of the second level signal.

8. The shift register of claim 1, comprising a plurality of transistors, the plurality of transistors are N-type channel thin film transistors, and the first level signal having a level lower than that of the second level signal.

9. A method for driving a shift register comprising a first input module, a second input module and an output module, the first input module, the second input module and the output module being electrically connected at a first node, the output module being electrically connected with the first input module at a second node, the first input module comprising a first transistor having a gate electrode thereof connected with a first input terminal, a source electrode thereof connected with a fifth input terminal and a drain electrode thereof connected with the first node, and a second transistor having a gate electrode thereof connected with the first input terminal, a source electrode thereof connected with a fourth input terminal and a drain electrode thereof connected with the second node, the method comprising:
during a first time period, inputting a second pulse signal to a second input terminal connected with the second input module, and inputting a first clock signal to a third input terminal connected with the second input module to control the second input module to transmit the second pulse signal to the first node;
during a second time period, inputting a first pulse signal to the first input terminal to control the first transistor and the second transistor to be turned on such that the first transistor transmits a first level signal inputted to the fifth input terminal to the first node after turned on, and the second transistor transmits a second clock signal inputted to the fourth input terminal to the second node after turned on, and using the second clock signal at the second node to control the output module to output a fourth pulse signal;
during a third time period, using the first clock signal to control the second input module to transmit the second pulse signal to the first node, and using the second pulse signal at the first node control the output module to output the fourth pulse signal,
wherein the second pulse signal is opposite in phase during the first time period and during the second time period, the fourth pulse signal is opposite in phase during the second time period and during the third time period, and each of the first clock signal and the second clock signal is opposite in phase during the first time period, during the second time period, and during the third time period.

10. The method of claim 9, wherein the first clock signal and the second clock signal are identical in phase during a first transition time period and a second transition time period, the first transition time period being between the first time period and the second time period and the second transition time period being between the second time period and the third time period.

11. The method of claim 9, wherein the second input module comprises a third transistor and a first capacitor, wherein a gate electrode of the third transistor is connected with the third input terminal, a source electrode of the third transistor is connected with the second input terminal, a drain electrode of the third transistor is connected with the first node, and the first capacitor is connected between the first node and the fourth input terminal; and, wherein
during the first time period, the first clock signal controls the third transistor to be turned on, the third transistor transmits the second pulse signal to the first node, and a level at the first node is maintained during the first time period under the effect of the first capacitor;
during the second time period, the first clock signal controls the third transistor to be turned off; and
during the third time period, the first clock signal controls the third transistor to be turned on, the third transistor transmits the second pulse signal to the first node, and a level at the first node is maintained during the third time period under the effect of the first capacitor.

12. The method of claim 9, wherein the output module comprises a fourth transistor, a fifth transistor, a sixth transistor and a second capacitor, wherein a gate electrode of the fourth transistor is connected with the first node, a source electrode of the fourth transistor is connected with a sixth input terminal, a drain electrode of the fourth transistor is connected with a first output terminal, a gate electrode of the fifth transistor is connected with the second node, a source electrode of the fifth transistor is connected with the fifth input terminal, a drain electrode of the fifth transistor is connected with the first output terminal, a gate electrode of the sixth transistor is connected with the first node, a source electrode of the sixth transistor is connected with the fifth input terminal, a drain electrode of the sixth transistor is connected with the second node, and the second capacitor is connected between the second node and the fifth input terminal; and, wherein
during the first time period, a level at the first node controls the fourth transistor and the sixth transistor to be turned off, the second node maintains a level of the first level signal inputted to the fifth input terminal under the coupling of the second capacitor, and a level at the second node controls the fifth transistor to be turned off;
during the second time period, the first node maintains the level of the first level signal under the effect of the first input module, the second node maintains a level of the second clock signal under the effect of the first input module, the level at the first node controls the fourth transistor and the sixth transistor to maintain a turned-off state, the level at the second node controls the fifth transistor to be turned on, and the fifth transistor transmits the first level signal inputted to the fifth input terminal to the first output terminal;
during the third time period, the first node maintains a level of the second pulse signal inputted to the second input terminal under the effect of the second input module, the level at the first node controls the fourth transistor and the sixth transistor to be turned on, the fourth transistor transmits the second level signal inputted to the sixth input terminal to the first output terminal, the sixth transistor transmits the first level signal to the second node, and the second node maintains the level of the first level signal and controls the fifth transistor to be turned off.

13. The method of claim 9, wherein the shift register further comprises a third input module, a seventh input terminal and a second output terminal, wherein the third input module is connected with the third input terminal, the fourth input terminal, the fifth input terminal, the sixth input terminal, the seventh input terminal and the second output terminal, and the second output terminal is electrically connected with the first input terminal at a third node; and, wherein
during the first time period, the seventh input terminal is inputted with a third pulse signal; and
during the second time period, the second output terminal outputs the first pulse signal.

14. The method of claim 9, wherein the shift register further comprises a third input module, a seventh input terminal, an eighth input terminal, a ninth input terminal and a second output terminal, wherein the third input module is connected with the fifth input terminal, the sixth input terminal, the seventh input terminal, the eighth input terminal, the ninth input terminal and the second output terminal, and the second output terminal and the first input terminal is electrically connected at a third node; and, wherein during the first time period, the seventh input terminal is inputted with a third pulse signal; and during the second time period, the second output terminal outputs the first pulse signal.

15. The method of claim 14, wherein a third clock signal and the ninth input terminal is inputted with a fourth clock signal is inputted to the eighth input terminal and wherein the first clock signal and the second clock signal have a first phase changing period t1, and the third clock signal and the fourth clock signal have a second phase changing period t2, wherein t1=2*t2.

16. The method of claim 9, wherein the shift register comprises a plurality of transistors, the plurality of transistors are P-type channel thin film transistors, and the first level signal having a level higher than that of the second level signal.

17. The method of claim 9, wherein the shift register comprises a plurality of transistors, the plurality of transistors are N-type channel thin film transistors, and the first level signal having a level lower than that of the second level signal.

\* \* \* \* \*